(12) United States Patent
Park (10) Patent No.: US 8,305,766 B2
(45) Date of Patent: Nov. 6, 2012

(54) ELECTRONIC COMPONENT-EMBEDDED PRINTED CIRCUIT BOARD AND METHOD OF MANUFACTURING THE SAME

(75) Inventor: Jin Seon Park, Chungcheongnam-do (KR)

(73) Assignee: Samsung Electro-Mechanics Co., Ltd., Suwon, Gyunggi-do (KR)

( * ) Notice: Subject to any disclaimer, the term of this patent is extended or adjusted under 35 U.S.C. 154(b) by 222 days.

(21) Appl. No.: 12/841,809

(22) Filed: Jul. 22, 2010

(65) Prior Publication Data

US 2011/0259630 A1    Oct. 27, 2011

(30) Foreign Application Priority Data

Apr. 26, 2010 (KR) .................. 10-2010-0038645

(51) Int. Cl.
*H01K 1/18* (2006.01)

(52) U.S. Cl. ........ 361/761; 361/762; 361/764; 361/765; 361/771

(58) Field of Classification Search ............... None
See application file for complete search history.

(56) References Cited

U.S. PATENT DOCUMENTS

| | | | | |
|---|---|---|---|---|
| 6,512,182 B2* | 1/2003 | Takeuchi et al. | ............ | 174/256 |
| 7,285,728 B2* | 10/2007 | Sunohara et al. | ............ | 174/260 |
| 7,639,473 B2* | 12/2009 | Hsu et al. | ............ | 361/260 |
| 7,727,802 B2* | 6/2010 | Sunohara et al. | ............ | 438/107 |
| 7,730,612 B2* | 6/2010 | Park et al. | ............ | 29/837 |
| 7,894,200 B2* | 2/2011 | Yoshino et al. | ............ | 361/761 |
| 7,947,906 B2* | 5/2011 | Lee et al. | ............ | 174/252 |
| 8,064,215 B2* | 11/2011 | Chung et al. | ............ | 361/763 |
| 8,198,541 B2* | 6/2012 | Sasaoka et al. | ............ | 174/252 |
| 2006/0191711 A1* | 8/2006 | Cho et al. | ............ | 174/260 |

* cited by examiner

*Primary Examiner* — Boris Chervinsky
(74) *Attorney, Agent, or Firm* — Blakely Sokoloff Taylor & Zafman LLP (57) ABSTRACT

Disclosed herein is a printed circuit board, including: a substrate including an insulation layer in which a cavity is formed; an electronic component mounted in the cavity of the substrate and having connection terminals; an insulation material layer formed on one side of the substrate to bury the electronic component; a first circuit layer formed on the other side of the substrate and including a connection pattern connecting with the connection terminals of the electronic component; and a second circuit layer formed on the insulation material layer. The printed circuit board is advantageous in that it can prevent the warpage thereof and ensure the reliability of electrical connection between an electronic component and a circuit layer by adjusting the thickness, thermal expansion coefficient and elastic modulus of insulation layer or the insulating material.

9 Claims, 6 Drawing Sheets

FIG.1A

Prior art

FIG.1B

Prior art

FIG.1C

Prior art

FIG.1D

Prior art

FIG.1E

Prior art

ELECTRONIC COMPONENT-EMBEDDED PRINTED CIRCUIT BOARD AND METHOD OF MANUFACTURING THE SAME

CROSS REFERENCE TO RELATED APPLICATION

This application claims the benefit of Korean Patent Application No. 10-2010-0038645, filed Apr. 26, 2010, entitled "A printed circuit board comprising embedded electronic component within and a method for manufacturing", which is hereby incorporated by reference in its entirety into this application.

BACKGROUND OF THE INVENTION

1. Technical Field

The present invention relates to an electronic component-embedded printed circuit board and a method of manufacturing the same.

2. Description of the Related Art

Various technologies are required to realize printed circuit boards (PCBs) in a market which requires semiconductor packages to have decreased profiles and a variety of functions.

Recently, the development of chip-embedded printed circuit boards has attracted considerable attention as part of next-generation multifunctional and small-sized packaging technology. Chip-embedded printed circuit boards must be designed to take into consideration high-functionality as well as the advantages of multi-functionality and miniaturization because they can improve the connection reliability problems occurring during the wire bonding for mounting flip chips or a ball grid array (BGA) or during a process of electrically connecting semiconductor chips using solder balls. Particularly, as printed circuit boards have become light, thin, short and small, ultra-precise packaging technologies have attracted considerable attention. In particular, in a soldering process for forming an electrical connection between a substrate and a main board or a molding process for mounting a substrate with a chip, it is increasingly important to improve the warpage of a semiconductor substrate. The warpage of a semiconductor substrate influences processing ability and productivity. Further, the warpage of a semiconductor substrate is a very important factor in causing the problem of solder balls not being formed on the solder ball pads of a semiconductor substrate during a soldering process, the problem in which semiconductor elements are not attached to solder balls formed on a semiconductor substrate at the time of mounting the semiconductor substrate with the semiconductor elements, and thus the problem in which the semiconductor elements do not electrically communicate with the semiconductor substrate. Moreover, the warpage of a semiconductor substrate may result in abnormal operation during transportation, molding or singulation.

FIGS. 1A to 1E are sectional views sequentially showing a conventional method of manufacturing an electronic component-embedded printed circuit board, in which both sides of the printed circuit board are symmetrical to each other in order to prevent the warpage of the printed circuit board. Hereinafter, conventional problems will be described with reference to FIGS. 1A to 1E.

Figure 1A:
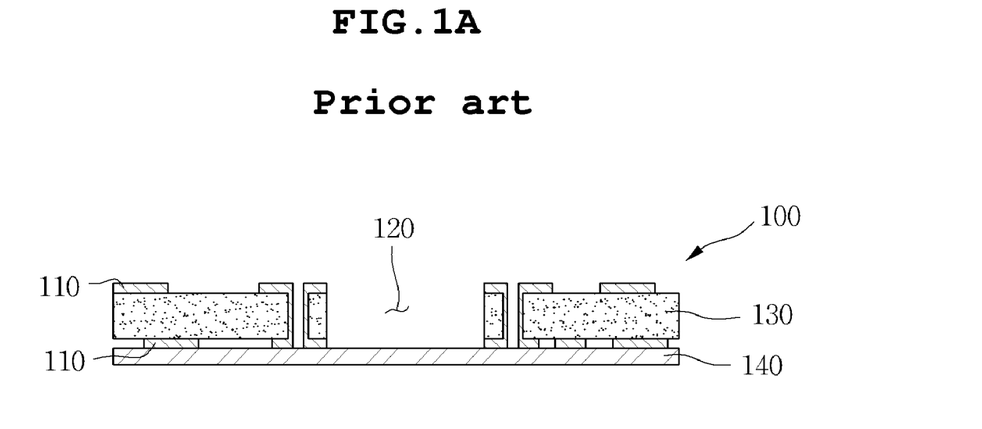
FIGS. 1A to 1E are sectional views sequentially showing a conventional method of manufacturing an electronic component-embedded printed circuit board.

First, as shown in FIG. 1A, there is provided a substrate 100 including: an insulation layer 130 having a cavity 120 in which an electronic component 200 can be disposed and first circuit patterns 110 formed on both sides thereof; and a tape 140 adhered to one side of the insulation layer 130.

Figure 1B:
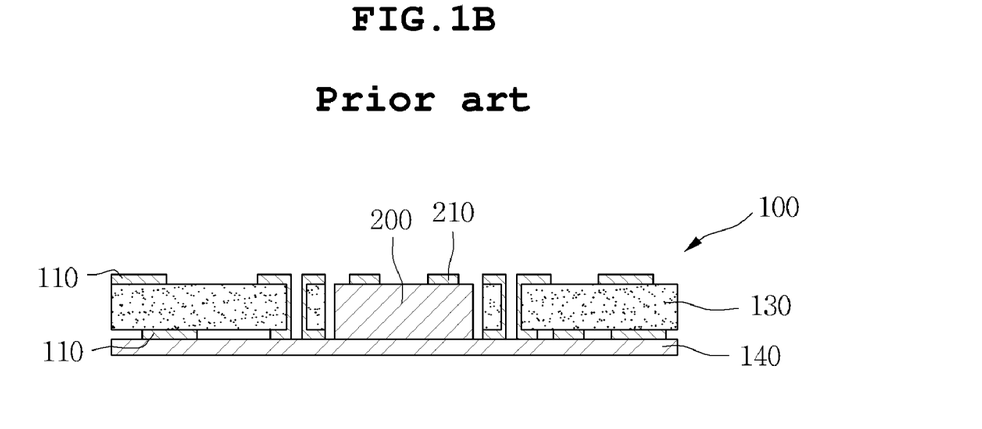

Subsequently, as shown in FIG. 1B, the electronic component 200 is disposed in the cavity 120 of the insulation layer 130. In this case, the electronic component 200 is installed in the cavity 120 in a face-up manner using a vacuum adsorption header (not shown), and is supported by the tape 140.

Figure 1C:
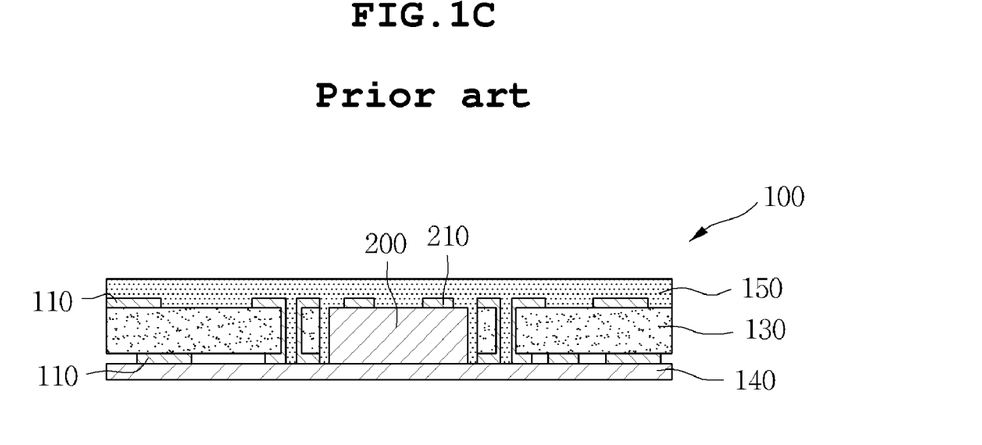

Subsequently, as shown in FIG. 1C, an insulating material layer 150 is formed on the substrate 100 including the cavity 120. The insulating material layer 150 is formed in the cavity 120 provided therein with the electronic component 200, and thus the electronic component 200 is buried in the insulating material layer 150.

Figure 1D:
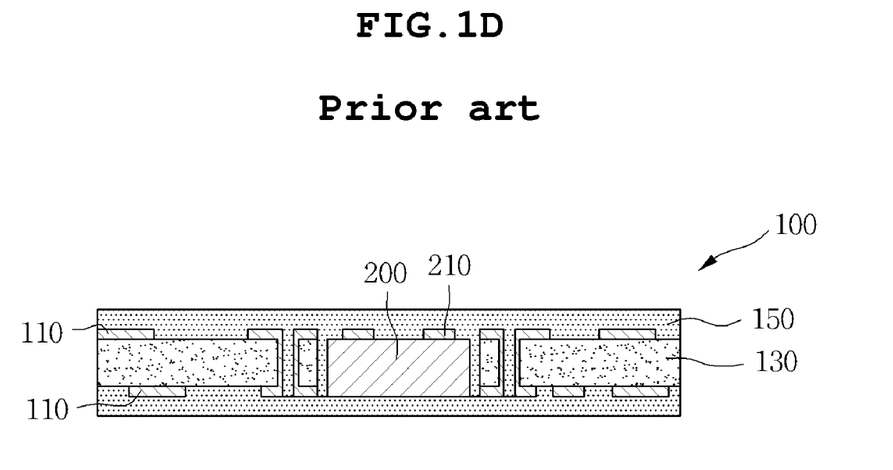

Subsequently, as shown in FIG. 1D, the tape 140 is removed from the substrate 100. Since the tape 140 serves to support the electronic component 200 before the electronic component 200 is fixed in the substrate 100 by the insulating material layer 150, it is removed after the insulating material layer 150 is formed. Then, the insulation material layer 150 is secondarily formed on the substrate 100 from which the tape 140 has been removed, thus entirely burying the electronic component 200 in the insulation material layer 150.

Figure 1E:
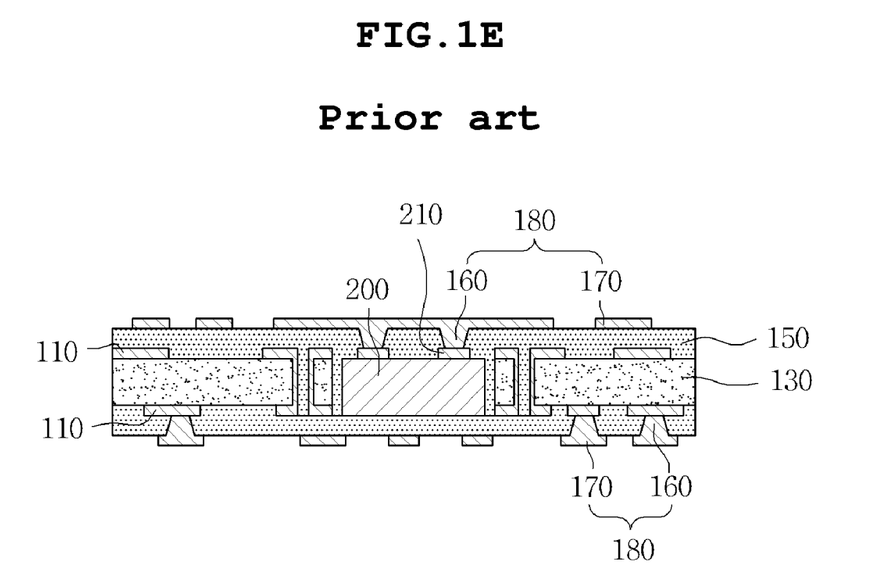

Subsequently, as shown in FIG. 1E, an insulating material layer 150 is formed even on the one side of the insulation layer 130 from which the tape 140 was removed, so that the electronic component 200 can be embedded in the substrate 100, and then circuit layers 180 including vias 160 and second circuit patterns 170 are formed on both sides of the insulating material layer 150. In this case, the vias 160 are electrically connected with the connecting terminals 210 of the electronic component 200.

However, the above electronic component-embedded printed circuit board is problematic in that it is difficult to make the printed circuit board to be light, thin, short and small because both sides thereof must be symmetrical to each other, and in that reliability of the connection is decreased because the connection terminals 210 of the electronic component 200 cannot be directly connected to the first circuit pattern 110. In order to solve the above problems, a new printed circuit board that is light, thin, short and small because an insulation material layer is not formed on one side thereof was proposed. However, this printed circuit board is also problematic in that it easily warps because both sides thereof are asymmetrical to each other unlike the conventional printed circuit board. Further, this printed circuit board is problematic in that, when an electronic component is disposed therein in a face down manner, a circuit layer connecting with the connection terminal of the electronic component is not suitably brought into contact with a substrate.

SUMMARY OF THE INVENTION

Accordingly, the present invention has been devised to solve the above-mentioned problems, and the present invention provides an electronic component-embedded printed circuit board which can prevent the warpage thereof and ensure the reliability of the connection with an electronic component by adjusting the thickness and material properties of an insulation layer or an insulating material, and a method of manufacturing the same.

An aspect of the present invention provides a printed circuit board, including: a substrate including an insulation layer in which a cavity is formed; an electronic component mounted in the cavity of the substrate and having connection terminals; an insulation material layer formed on one side of the substrate to bury the electronic component; a first circuit layer formed on the other side of the substrate and including a connection pattern connecting with the connection terminals of the electronic component; and a second circuit layer formed on the insulation material layer, wherein the thickness of the insulation layer ranges from 80 to 120% of a thickness of the electronic component, and the thickness of the insulating material layer ranges from 5 to 40% of a thickness of the electronic component.

Here, the insulation layer may have a thermal expansion coefficient of 5~30 ppm/° C.

Further, the insulation layer may have an elastic modulus of 10~50 GPa.

Further, the insulating material layer may have a thermal expansion coefficient of 4~29 ppm/° C., which is smaller than that of the insulation layer.

Further, the insulation layer may have an elastic modulus of 9~49 GPa, which is smaller than that of the insulation layer.

Further, the printed circuit board may further include: build-up insulation layers and build-up circuit layers formed on both sides of the substrate; and solder resist layers formed on the build-up layers.

Further, the substrate may be a copper clad laminate at least one side of which is coated with copper foil.

Further, the ratio of the thickness of the build-up circuit layer formed on one side of the copper clad laminate and the thickness of the build-up circuit layer formed on the other side of the copper clad laminate may be 1:1.08~1:1.2, and the ratio of the thickness of the solder resist layer formed on one side of the build-up circuit layer to the thickness of the solder resist layer formed on one side of the build-up circuit layer may be 1:1.08~1:1.2.

Further, the insulation layer may be completely cured.

Another aspect of the present invention provides a method of manufacturing a printed circuit board, including: providing a substrate including an insulation layer; forming a cavity in the substrate in a thickness direction; mounting an electronic component having connection terminals in the cavity; forming an insulating material layer on one side of the substrate to bury the electronic component; forming a first circuit layer including a connection pattern connecting with the connection terminals of the electronic component on the other side of the substrate; and forming a second circuit layer on the insulating material layer, wherein the thickness of the insulation layer ranges from 80 to 120% of a thickness of the electronic component, and the thickness of the insulating material layer ranges from 5 to 40% of a thickness of the electronic component.

Here, the insulation layer may have a thermal expansion coefficient of 5~30 ppm/° C.

Further, the insulation layer may have an elastic modulus of 10~50 GPa.

Further, the insulating material layer may have a thermal expansion coefficient of 4~29 ppm/° C., which is smaller than that of the insulation layer.

Further, the insulation layer may have an elastic modulus of 9~49 GPa, which is smaller than that of the insulation layer.

Further, the mounting of the electronic component may include: adhering a tape onto the other side of the substrate; and disposing the electronic component on the tape exposed through the cavity such that the electronic component is mounted in the cavity.

Further, the tape may be selected from polyimide (PI) tape, thermo-foaming tape, teflon tape and UV tape.

Further, the method may further include, after the forming of the second circuit layer, forming build-up circuit layers and build-up insulation layers on the first circuit layer and the second circuit layer; and forming solder resist layers on the build-up circuit layers.

Further, the substrate may be a copper clad laminate at least one side of which is coated with copper foil.

Further, the ratio of the thickness of the build-up circuit layer formed on one side of the copper clad laminate to the thickness of the build-up circuit layer formed on the other side of the copper clad laminate may be 1:1.08~1:1.2, and the ratio of the thickness of the solder resist layer formed on one side of the build-up circuit layer to the ratio of the thickness of the solder resist layer formed on one side of the build-up circuit layer may be 1:1.08~1:1.2.

Further, the insulation layer may be completely cured.

Various objects, advantages and features of the invention will become apparent from the following description of embodiments with reference to the accompanying drawings.

The terms and words used in the present specification and claims should not be interpreted as being limited to typical meanings or dictionary definitions, but should be interpreted as having meanings and concepts relevant to the technical scope of the present invention based on the rule according to which an inventor can appropriately define the concept of the term to describe the best method he or she knows for carrying out the invention.

BRIEF DESCRIPTION OF THE DRAWINGS

The above and other objects, features and advantages of the present invention will be more clearly understood from the following detailed description taken in conjunction with the accompanying drawings, in which.

DESCRIPTION OF THE PREFERRED EMBODIMENTS

The objects, features and advantages of the present invention will be more clearly understood from the following detailed description and preferred embodiment taken in conjunction with the accompanying drawings. Throughout the accompanying drawings, the same reference numerals are used to designate the same or similar components, and redundant descriptions thereof are omitted. Further, in the following description, the terms "one side," "the other side," "first," "second" and the like are used to differentiate a certain component from other components, but the configuration of such components should not be construed to be limited by the terms. Further, in the description of the present invention, when it is determined that the detailed description of the related art would obscure the gist of the present invention, the description thereof will be omitted.

Hereinafter, preferred embodiments of the present invention will be described in detail with reference to the attached drawings.

Figure 2:
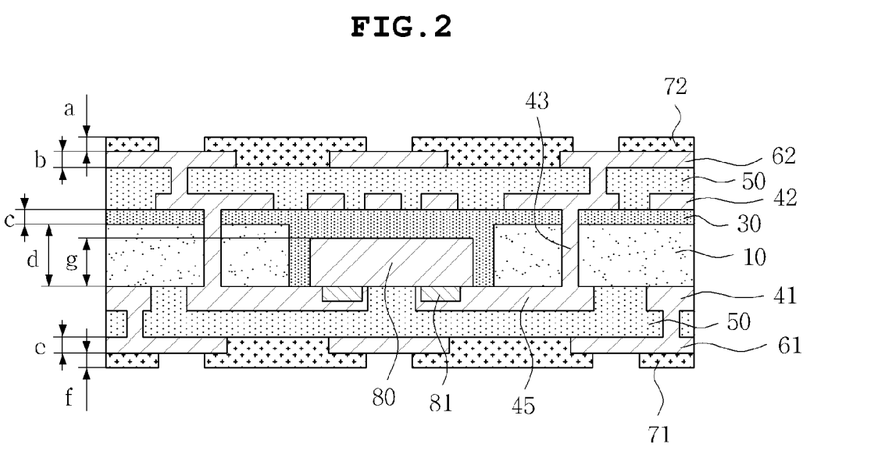
FIG. 2 is a sectional view showing an electronic component-embedded printed circuit board according to an embodiment of the present invention.

FIG. 2 is a sectional view showing an electronic component-embedded printed circuit board according to an embodiment of the present invention.

As shown in FIG. 2, the electronic component-embedded printed circuit board according to this embodiment includes: a substrate 1 including an insulation layer 10 in which a cavity 12 is formed; an electronic component 80 mounted in the cavity 12 of the substrate 1 and having connection terminals 81; an insulation material layer 30 formed on one side of the substrate 1 to bury the electronic component 80; a first circuit layer 41 formed on the other side of the substrate 1 and including a connection pattern 45 connecting with the connection terminals 81 of the electronic component 80; and a second circuit layer 42 formed on the insulation material layer 30, wherein the thickness of the insulation layer 10 is in the range of 80 to 120% of the thickness of the electronic component 80, and the thickness of the insulating material layer 30 is in the range of 5 to 40% of the thickness of the electronic component 80.

The substrate 1 includes the insulation layer 10. A copper clad laminate may be used as the substrate 1, and, in this case, the copper clad laminate may include an insulation layer including copper foil layers formed on one side or both sides thereof. However, the substrate is not limited to this copper clad laminate. In order to prevent the warpage of the printed circuit board of the present invention, the thickness (d shown in FIG. 2) of the insulation layer 10 included in the substrate 1 is adjusted in a predetermined range, and correlates with the thickness (g shown in FIG. 2) of the electronic component 80 mounted in the cavity 12 of the substrate 1. Concretely, the thickness of the insulation layer 10 may be adjusted to be within the range of 80 to 120%, more preferably, 85 to 105% of the thickness of the electronic component 80. When the thickness of the insulation layer 10 is more than 120% of the thickness of the electronic component 80, an insulation distance is increased, and thus electrical properties are deteriorated. In contrast, when the thickness of the insulation layer 10 is less than 80% of the thickness of the electronic component 80, chip cracks are formed, thus causing the inferiority thereof. That is, when the thickness of the insulation layer 10 deviates from the range, it is difficult to make the printed circuit board light, thin, short and small, and it is industrially inefficient.

Further, in order to prevent the warpage of the printed circuit board of the present invention, the thermal expansion coefficient (CTE) of the insulation layer 10 may be within a predetermined range. Hereinafter, the range will be described. That is, in order to prevent the warpage of the printed circuit board, the insulation layer 10 may have a thermal expansion coefficient of 5~30 ppm/° C., more preferably, 7~23 ppm/° C. When the thermal expansion coefficient of the insulation layer is greater than 30 ppm/° C., the thermal deformation rate thereof is increased, so that scale deviation and panel twist occur, thereby decreasing reliability. In contrast, when the thermal expansion coefficient of the insulation layer is less than 5 ppm/° C., the substrate 1 is more seriously warped after the insulating material layer 30 is formed, so that it is difficult to perform a plating process, with the result that plating thickness becomes nonuniform even if the plating process is performed, thereby deteriorating electrical characteristics.

Furthermore, in order to prevent the warpage of the printed circuit board of the present invention, the elastic modulus of the insulation layer 10 may be within a predetermined range. Hereinafter, the range will be described. That is, in order to prevent the warpage of the printed circuit board, the insulation layer 10 may have an elastic modulus of 10~50 GPa, more preferably, 15~45 GPa. When the elastic modulus of the insulation layer 10 is greater than 50 GPa, its thermal properties are deteriorated, so that its reliability becomes low and it becomes weak to stress. In contrast, when the elastic modulus of the insulation layer 10 is less than 10 GPa, the insulation layer 10 itself is more seriously warped, so that it is difficult to adhere the electronic component 80 to the insulation layer 10, and the precision of the adhesion therebetween is decreased.

It is more preferred that the substrate be formed such that the thickness, thermal expansion coefficient and elastic modulus of the insulation layer 10 are adjusted to be within the predetermined ranges, respectively.

The electronic component 80 is embedded in the printed circuit board of the present invention. Both active elements and passive elements can be used as the electronic component 80. However, in the electronic component-embedded printed circuit board of the present invention, when the electronic component 80 is an active element, it can be mounted only in a face down manner. Further, when the electronic component 80, which is an active element, is embedded in the printed circuit board of the present invention, the electronic component 80 is directly connected to a circuit layer without additional bumps, thus improving the reliability of the electrical connection.

The insulating material layer 30 is formed on one side of the substrate 1, and serves to bury the electronic component 80 mounted in the cavity 12 of the substrate 1. That is, the electronic component 80 may be buried by injecting an insulating material into the space between the cavity 12 and the electronic component 80 and then curing the injected insulating material, and, in this case, it is not required that the insulating material be completely cured. In order to prevent the warpage of the electronic component-embedded printed circuit board of the present invention, the thickness of the insulating material layer 30 may be within a predetermined range. Here, the thickness (c shown in FIG. 2) of the insulating material layer 30 refers to the distance between the top surface of the substrate 1 and the top surface of the insulating material 30. The thickness (c) of the insulation material layer 30 may be adjusted to be within the range of 5 to 40%, preferably, 7 to 20% of the thickness of the electronic component 80 mounted in the cavity 12. When the thickness (c) of the insulation material layer 30 is greater than 40% of the thickness of the electronic component 80, electrical properties are deteriorated because an insulation distance is increased, and the strength of the substrate is decreased because the thickness of the insulating material layer 30 is increased compared to the thickness of the insulation layer 10. In contrast, when the thickness of the insulating material layer 30 is less than 5% of the thickness of the electronic component 80, resin flow rate sufficient for filling the space between the electronic component 80 and the cavity 12 can be obtained.

Further, in order to prevent the warpage of the printed circuit board of the present invention, the thermal expansion coefficient (CTE) of the insulating material layer 30 may be within a predetermined range. Hereinafter, the range is described. That is, in order to prevent the warpage of the printed circuit board, the insulating material layer 30 may have a thermal expansion coefficient of 4~29 ppm/° C., more preferably, 6~15 ppm/° C. However, the thermal expansion coefficient of the insulating material layer 30 must be smaller than that of the insulation material layer 10. When the thermal expansion coefficient of the insulating material layer 30 is greater than that of the insulation material layer 10, the substrate 1 is more seriously warped, so that it is impossible to perform subsequent processes, with the result that the plating thickness and circuit scale become non-uniform even if the subsequent processes are performed, thereby it is impossible to realize the printed circuit board of the present invention.

Further, in order to prevent the warpage of the printed circuit board of the present invention, the elastic modulus of the insulating material layer 30 may be within a predetermined range. Hereinafter, the range is described. That is, in order to prevent the warpage of the printed circuit board, the insulating material layer 30 may have an elastic modulus of 9~49 GPa, more preferably, 14~44 GPa. However, the elastic modulus of the insulating material layer 30 must be smaller than that of the insulation material layer 10. When the elastic modulus of the insulating material layer 30 is greater than that of the insulation material layer 10, the substrate 1 is more seriously warped, so that it is impossible to perform subsequent processes, with the result that plating thickness and circuit scale become non-uniform even if the subsequent processes are performed, thereby it is impossible to realize the printed circuit board of the present invention.

Further, the warpage of the printed circuit board of the present invention may be prevented by using the substrate 1 including the insulating material layer 30 having the above predetermined thickness, thermal expansion coefficient and elastic modulus. Moreover, it is the most preferred that the thickness, thermal expansion coefficient and elastic modulus of the insulating material layer 30 be adjusted to be within the above predetermined ranges, that the thickness, thermal expansion coefficient and elastic modulus of the insulation layer 10 be adjusted to be within the above predetermined ranges, and that the thickness, thermal expansion coefficient and elastic modulus of the insulating material layer 30 be smaller than those of the insulation layer 10, respectively. Here, when the thickness, thermal expansion coefficient and elastic modulus of the insulating material layer 30 are greater than those of the insulation layer 10, respectively, the substrate 1 is more seriously warped, so that it is impossible to perform subsequent processes, with the result that plating thickness and circuit scale become non-uniform even if the subsequent processes are performed, thereby it is impossible to realize the printed circuit board of the present invention.

The first circuit layer 41 is formed on the other side of the substrate 1, and includes a connection pattern 45 connecting with the connection terminals 81 of the electronic component 80. Since this first circuit layer 41 is formed without additionally forming an insulation layer for forming a circuit layer, it can be directly connected with the connection terminals 81 of the electronic component 80, thus ensuring the reliability of the electrical connection of the electronic component 80 and enabling the printed circuit board to become light, thin, short and small. In particular, due to the formation of the connection pattern 45, the electronic component 80, if it is an active element, can be directly connected to the first circuit layer 41 without additional bumps.

The second circuit layer 42 is formed on the insulating material layer 30, and build-up insulation layers 50 and build-up circuit layers 61 and 62 may be sequentially formed on the first circuit layer 41 and the second circuit layer 42, respectively. Then, solder resist layers 71 and 72 are respectively formed on the build-up circuit layers 61 and 62 to prevent the wires from shorting or forming an abnormal connection due to contact with foreign matter or because of physical damage. Further, in order to electrically connect the first and second circuit layers 41 and 42 with external circuits, openings may be formed in the solder resist layers 71 and 72 to expose pads.

The printed circuit board of the present invention may further include the build-up insulation layers 50 and build-up circuit layers 61 and 62 formed on both sides of the substrate 1, and the solder resist layers 71 and 72 formed on the build-up layers 61 and 62. Here, in order to prevent the warpage of the printed circuit board, the ratio of the thickness (b shown in FIG. 2) of the build-up circuit layer 62 formed on one side of the substrate to the thickness (e shown in FIG. 2) of the build-up circuit layer 61 formed on the other side of the substrate is 1:1.08~1:1.2, and the ratio of the thickness (a shown in FIG. 2) of the solder resist layer 72 formed on one side of the build-up circuit layer 62 to the thickness (f shown in FIG. 2) of the solder resist layer 71 formed on one side of the build-up circuit layer 61 is 1:1.08~1:1.2.

FIGS. 3 to 11 are sectional views sequentially showing the method of manufacturing the electronic component-embedded printed circuit board according to the embodiment of the present invention. Here, the description thereof overlapping with that of the above electronic component-embedded printed circuit board will be omitted.

As shown in FIGS. 3 to 11, the method of manufacturing the electronic component-embedded printed circuit board according to the embodiment of the present invention includes the steps of: (A) providing a substrate 1 including an insulation layer 10; (B) forming a cavity 12 in the substrate 1 in a thickness direction; (C) mounting an electronic component 80 having connection terminals 81 in the cavity 12; (D) forming an insulating material layer 30 on one side of the substrate 1 to bury the electronic component 80 in the substrate 1; (E) forming a first circuit layer 41 including a connection pattern connecting with the connection terminals 81 of the electronic component 80 on the other side of the substrate 1; and (F) forming a second circuit layer 42 on the insulating material layer 30. Here, the thickness of the insulation layer 10 included in the substrate 1 may be in the range of 80 to 120% of the thickness of the electronic component 80, and the thickness of the insulating material layer 30 formed on one side of the substrate 1 may be in the range of 5 to 40% of the thickness of the electronic component 80.

Figure 3:
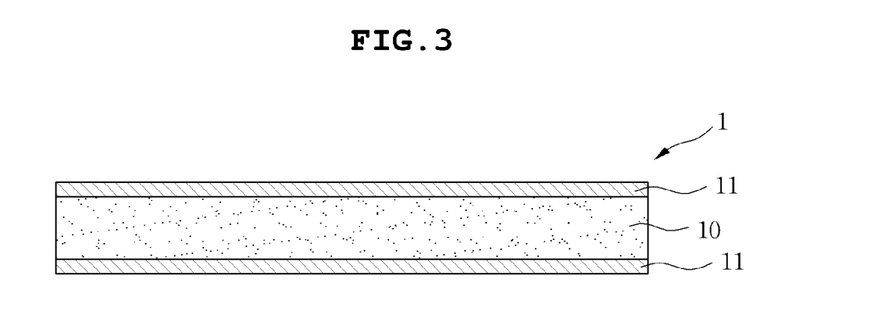
FIGS. 3 to 11 are sectional views sequentially showing a method of manufacturing the electronic component-embedded printed circuit board according to the embodiment of the present invention.

In FIG. 3, a substrate 1 including an insulation layer 10 is provided. Here, a copper clad laminate (CCL) including an insulation layer 10 and copper foil layers 11 formed on both sides of the insulation layer 10 may be used as the substrate 1.

Figure 4:
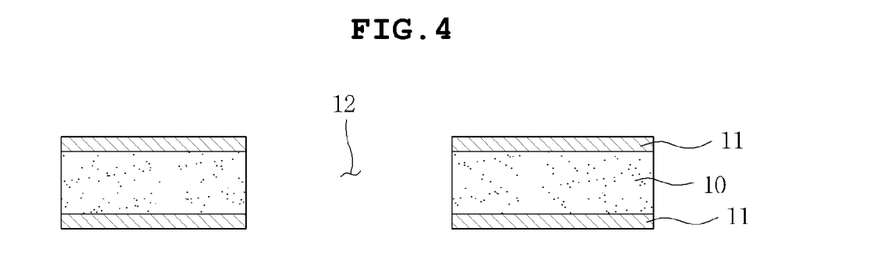
Figure 5:
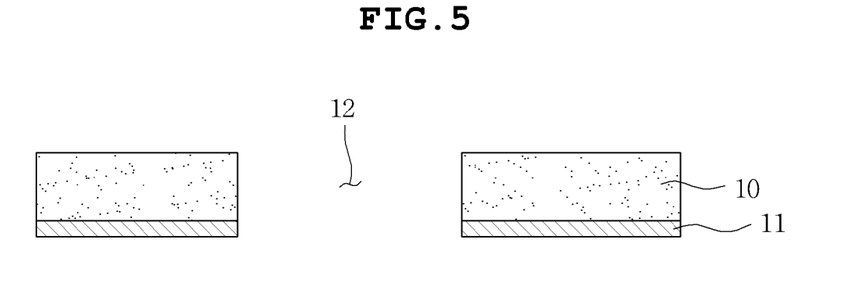

Subsequently, in FIG. 4, a cavity 12 is formed in the copper clad laminate in a thickness direction. Subsequently, as shown in FIG. 5, the copper foil layer formed on one side of the insulation layer 10 is removed. In this case, it is obvious that a copper clad laminate including an insulation layer and a copper foil layer formed on one side of the insulation layer be used. Here, the thickness of the insulation layer 10 is in the range of 80 to 120%, preferably, 86 to 105% of the thickness of the electronic component 80 mounted in the cavity 12. Further, other material properties, such as the thermal expansion coefficient and the elastic modulus thereof will be omitted because they were already mentioned in the description of the above electronic component-embedded printed circuit board.

Figure 6:
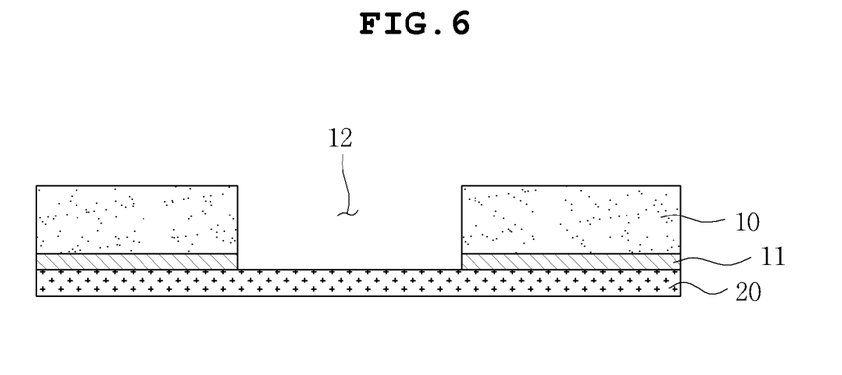
Figure 7:
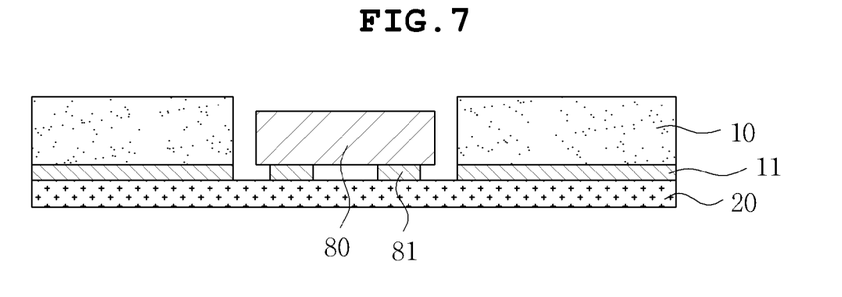
Figure 8:
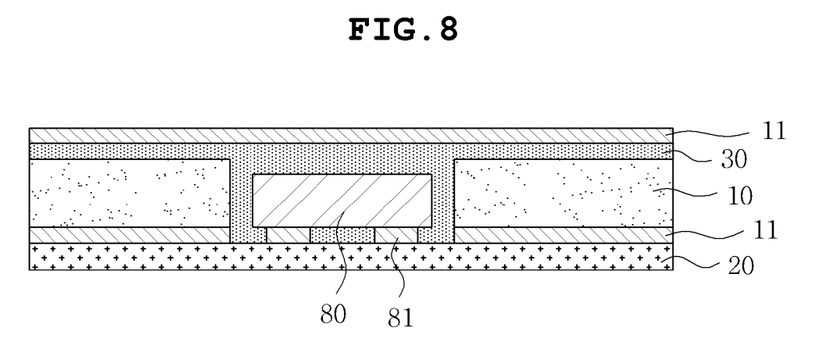
Figure 9:
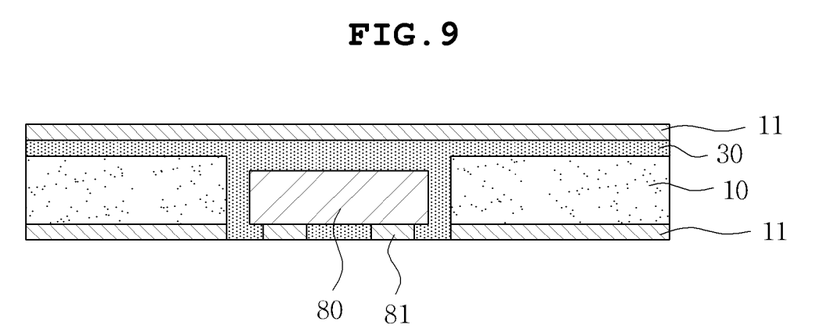

Subsequently, in FIGS. 6 to 9, an electronic component 80 having connection terminals 81 is mounted in the cavity 12 of the copper clad laminate, and then an insulating material layer 30 is formed on one side of the copper clad laminate to bury the electronic component 80. Concretely, as shown in FIG. 6, a tape 20 is adhered onto the other side of the copper clad laminate, and then, as shown in FIG. 7, the electronic component 80 is disposed on the tape 20 exposed through the cavity 12 to mount the electronic component 80 in the copper clad laminate, and then, as shown in FIG. 8, the insulating material layer 30 is formed on one side of the copper clad laminate to bury the electronic component 80 in the copper clad laminate, and then, as shown in FIG. 9, the tape is removed. Here, since the tape 20 serves to fix the electronic component 80 before the electronic component 30 is buried by forming the insulation material layer 30, the tape 20 may be made of an adhesive whose residue does not remain on the copper clad laminate or the electronic component 80 after it is removed. Further, the tape 20 must have excellent heat resistance because heat is applied during the process of forming the insulating material layer 30. For example, a polyimide (PI) tape, a thermo-foaming tape, a teflon tape or a UV tape may be used as the tape 20.

In the mounting of the electronic component 80 in the cavity 12, when the electronic component 80 is an active element, it can be mounted only in a face down manner, and, when the electronic component 80 is a passive element, it can be mounted without limitation. The reason why an active element must be mounted only in a face down manner is because the insulating material layer 30 is formed only on one side of the copper clad laminate and because it is required that a circuit layer formed on the other side of the copper clad laminate be directly connected with the connection terminals 81 of the electronic component 80. Therefore, according to the present invention, the electronic component, which is an active element, can be mounted only in a face down manner in which the connection terminals 81 are disposed on the other side of the copper clad laminate. However, since a passive element is not provided with connection terminals, the electronic component, which is a passive element, can be mounted in the cavity 12 of the copper clad laminate using any one of a face down manner and a face up manner.

In FIG. 8, the electronic component 80 is buried by forming the insulating material layer 30 on one side of the copper clad laminate. Here, the insulating material layer 30 may be made of an insulating material generally used in printed circuit boards, and the thickness of the insulation material layer 30 may be in the range of 5 to 40%, preferably, 7 to 20% of the thickness of the electronic component 80 mounted in the cavity 12. Further, other material properties, such as the thermal expansion coefficient and the elastic modulus, thereof will be omitted because they were already mentioned in the description of the above electronic component-embedded printed circuit board.

Figure 10:
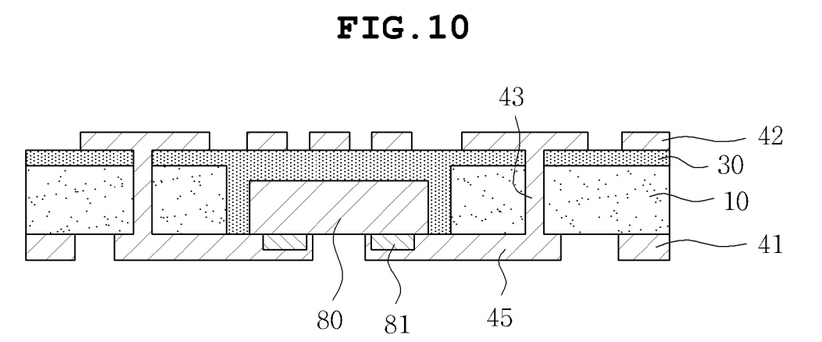

Subsequently, in FIGS. 9 and 10, a first circuit layer 41 including a connection pattern 45 connecting with the connection terminals 81 of the electronic component 80 is formed on the other side of the copper clad laminate including the insulating material layer 30 on one side thereof, and a second circuit layer 42 is formed on the insulating material layer 30. As shown in FIGS. 9 and 10, the insulating material layer 30 and the copper foil layer 11 are sequentially formed on one side of the copper clad laminate, and then the tape 20 adhered on the other side of the copper clad laminate is removed. Then, the first circuit layer 41 and the second circuit layer 42 may be simultaneously or sequentially formed on both sides of the copper clad laminate. Here, the first circuit layer 41 is formed by patterning the copper foil layer 11 formed on the other side of the copper clad laminate provided on one side thereof with the insulating material layer 30 the other side of which is connected with the connection terminals 81 of the electronic component 80. However, when the first circuit layer 41 is formed while applying a copper foil layer on the other side of the copper clad laminate in step F as shown in FIG. 10, the peeling value of the copper foil layer is rapidly decreased, so that the first circuit layer 41 is not suitably adhered on the insulation layer 10, with the result that it is difficult to form the first circuit layer 141 on the insulation layer 10. Therefore, as described in step (A), it is preferred that a copper layer be formed on the other side of the copper clad laminate provided on one side thereof with the insulating material layer 30 whose the other side is connected with the connection terminals 81 of the electronic component 80.

Figure 11:
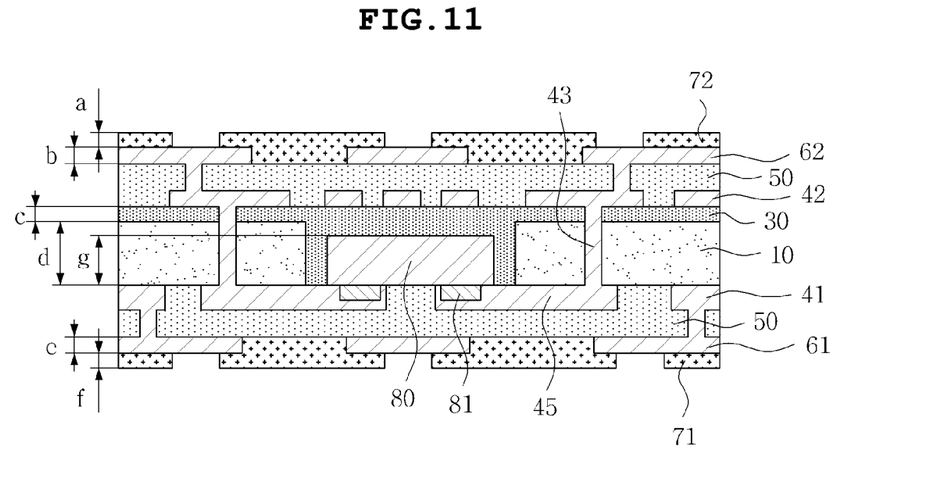

Subsequently, in FIG. 11, build-up insulation layers 50 and build-up circuit layers 61 and 62 are sequentially formed on the first circuit layer 41 and the second circuit layer 42, and solder resist layers 71 and 72 are respectively formed on the build-up circuit layers 61 and 62. In particular, the warpage of the printed circuit board can be prevented by controlling the thickness ratio of the build-up circuit layers 61 and 62 and the thickness ratio of the solder resist layers 71 and 72 in a predetermined range. Specifically, the ratio of the thickness (b shown in FIG. 11) of the build-up circuit layer 62 formed on one side of the substrate to the thickness (e shown in FIG. 11) of the build-up circuit layer 61 formed on the other side of the substrate is 1:1.08~1:1.2, and the ratio of the thickness (a shown in FIG. 11) of the solder resist layer 72 formed on one side of the build-up circuit layer 62 to the thickness (f shown in FIG. 11) of the solder resist layer 71 formed on one side of the build-up circuit layer 61 is 1:1.08~1:1.2.

Hereinafter, the present invention will be described in more detail with reference to the following Examples and Comparative Examples. However, the scope of the present invention is not limited thereto.

Examples 1 and 2 and Comparative Examples 1 and 2

Whether a printed circuit board is warped depending on the changes in thicknesses, thermal expansion coefficients and elastic moduli of the insulation layer and the insulating material layer is shown in Table 1 below.

TABLE 1

| Examples | Insulation layer (d) | | | Insulating material layer (c) | | | Results |
|---|---|---|---|---|---|---|---|
| | Thickness (d/g) * 100 | CTE (ppm/° C.) | Modulus (GPa) | Thickness (c/g) * 100 | CTE (ppm/° C.) | Modulus (GPa) | Occurrence of warpage |
| Exp. 1 | 80 | 14 | 28 | 30 | 14 | 28 | NO |
| Exp. 2 | 100 | 11 | 27 | 13 | 11 | 27 | NO |
| comp. Exp. 1 | 75 | 30 | 28 | 30 | 45 | 29 | YES |
| comp. Exp. 2 | 135 | 10 | 21 | 13 | 7 | 34 | YES |

Considering the correlation between experimental data and whether a printed circuit board is warped, it can be seen that the printed circuit board is not warped when the thicknesses and material properties of the insulation layer and the insulating material layer are present in a predetermined range, but the printed circuit board is warped when the thickness and material properties thereof deviate from the range, thus deteriorating the quality of the printed circuit board.

As described above, according to the printed circuit board of the present invention, the reliability of the electrical connection of an electronic component can be ensured because the connection terminals of the electronic component are directly connected to a circuit layer.

Further, according to the printed circuit board of the present invention, the printed circuit board can become light, thin, short and small because a circuit layer is formed without additionally applying an insulating material on the other side of a substrate.

Further, according to the printed circuit board of the present invention, an electronic component, if it is an active element, can be directly connected to a circuit layer without additional bumps.

Further, according to the method of manufacturing a printed circuit board of the present invention, the reliability of the adhesion between an insulation layer and a circuit layer can be increased because a substrate including an insulation layer provided on the other side thereof with a copper foil layer is used.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

Simple modifications, additions and substitutions of the present invention belong to the scope of the present invention, and the specific scope of the present invention will be clearly defined by the appended claims.

What is claimed is:

1. A printed circuit board, comprising:
   a substrate including an insulation layer in which a cavity is formed;
   an electronic component mounted in the cavity of the substrate and having connection terminals;
   an insulation material layer formed on one side of the substrate to bury the electronic component;
   a first circuit layer formed on the other side of the substrate and including a connection pattern connecting with the connection terminals of the electronic component; and
   a second circuit layer formed on the insulation material layer, wherein a thickness of the insulation layer ranges from 80 to 120% of a thickness of the electronic component, and a thickness of the insulating material layer ranges from 5 to 40% of a thickness of the electronic component.

2. The printed circuit board according to claim 1, wherein the insulation layer has a thermal expansion coefficient of 5~30 ppm/° C.

3. The printed circuit board according to claim 1, wherein the insulation layer has an elastic modulus of 10~50 GPa.

4. The printed circuit board according to claim 1, wherein the insulating material layer has a thermal expansion coefficient of 4~29 ppm/° C., which is smaller than that of the insulation layer.

5. The printed circuit board according to claim 1, wherein the insulating material layer has an elastic modulus of 9~49 GPa, which is smaller than that of the insulation layer.

6. The printed circuit board according to claim 1, further comprising: build-up insulation layers and build-up circuit layers formed on both sides of the substrate; and solder resist layers formed on the build-up layers.

7. The printed circuit board according to claim 1, wherein the substrate is a copper clad laminate at least one side of which is coated with copper foil.

8. The printed circuit board according to claim 6, wherein the ratio of the thickness of the build-up circuit layer formed on one side of the substrate to the thickness of the build-up circuit layer formed on the other side of the substrate is 1:1.08~1:1.2, and the ratio of the thickness of the solder resist layer formed on one side of the build-up circuit layer to the thickness of the solder resist layer formed on one side of the build-up circuit layer is 1:1.08~1:1.2.

9. The printed circuit board according to claim 1, wherein the insulation layer is completely cured.

* * * * *